United States Patent [19]

Horna

[11] 4,251,802

[45] Feb. 17, 1981

[54] ANALOG TO DIGITAL CONVERTER

[76] Inventor: Otakar A. Horna, 5017 Del Ray Ave., Bethesda, Md. 20014

[21] Appl. No.: 865,132

[22] Filed: Dec. 28, 1977

Related U.S. Application Data

[63] Continuation of Ser. No. 665,651, Mar. 10, 1976, abandoned, which is a continuation of Ser. No. 470,781, May 17, 1974, abandoned.

[51] Int. Cl.[2] .............................................. H03K 13/02
[52] U.S. Cl. .................. 340/347 AD; 358/13
[58] Field of Search ............ 340/347 M, 347 AD; 324/99 D; 358/13

[56] References Cited

U.S. PATENT DOCUMENTS 3,516,085   6/1970   Dano .......................... 340/347 AD
3,721,975   3/1973   Brinkman ..................... 340/347 AD Primary Examiner—Charles D. Miller

[57] ABSTRACT

An improved analog to digital converter of the parallel or series-parallel type having expanded range for a given number of comparators in the quantizer. The converter is particularly adapted to convert analog signals, such as television signals, of a type in which a large percentage of the time the analog signal falls within only a portion of the predetermined full range. The quantizer is capable of converting only signals within the portion of the full range. Switching circuitry having a hysteresis characteristic shifts the effective range of the quantizer to additional overlapping ranges to permit conversion of signals outside the portion of the predetermined range.

25 Claims, 4 Drawing Figures

ANALOG TO DIGITAL CONVERTER

This is a continuation, of application Ser. No. 665,651, filed Mar. 10, 1976 now abandoned, a continuation of Appln. Ser. No. 470,781 filed May 17, 1974, now abandoned.

BACKGROUND OF THE INVENTION

The invention is an improved analog to digital converter.

In the near future a substantial part of all long distance information transmission, e.g. voice, facsimile, data, TV, will be carried out in digital form. Thus, analog to digital converters (A/DC) and digital to analog converters (D/AC) will be an integral part of all modems for information transmission and can represent a substantial part of the costs of such modems. Certain types of information, e.g., voice, telemetry, is relatively slow and can be easily handled by simple and inexpensive series operated A/DC with precisions of 5 to 15 bits and conversion times in excess of five microseconds. For television and other analog signals with frequencies over 0.5 MHz, a conversion time of much less than one microsecond is necessary. Consequently, parallel or series-parallel converters, which are complex, expensive and usually have a precision of less than 9 bits, are used. Examples of the parallel and series-parallel converters for high speed conversion are found in O. A. Horna, "A 150 Mb/s A/D and D/A Conversion System", COMSAT Technical Review, Vol. 2, No. 1, Spring 1972, pp. 39-72, (hereinafter Reference 1).

In transmission systems of the above-described type wherein information from different channels is multiplexed into a single bit stream, each channel typically has its own A/DC, with multiplexing performed on the digital side of the modem. However, advances in solid state switches permit multiplexing on the analog side provided a very fast A/DC converter is available for use on the multiplexed analog information stream. Such techniques will result in a reduction in the number of A/DC converters necessary in the modem. It is explained in Reference 1 that there are only two configurations possible for very fast (Tc < <1 usec) converters. They are the parallel type, an example of which is shown in FIG. 7 of Reference 1, and the series-parallel type, an example of which is shown in FIG. 8 of Reference 1.

As will be understood by those skilled in the art, and as can be ascertained from Reference 1, the basic building block of both types of converters is the same. FIG. 4 of Reference 1 shows an eight comparator quantizer which serves as the basic building block for the parallel and series-parallel converters of FIGS. 7 and 8, respectively. An eight comparator quantizer, which is used herein only as a representative example, provides eight quantization levels which can be fully represented by a three bit code.

A disadvantage of the parallel type converter is that it requires $2^n$ comparators, where n is the number of bits required to encode an analog signal. For example, if it is desired to provide sixteen discrete quantization levels for an analog signal, this can be fully encoded into four binary bits (i.e., n=4). The number of comparators required is $2^4=16$. A four bit A/DC utilizing sixteen comparators (two 8-comparator building blocks) is shown in FIG. 7 of Reference 1.

A series-parallel type converter using sixteen comparators, eight each in the first and second stages, can convert the same analog signal into a six bit code, thereby providing a total of $2^6=64$ discrete quantization levels. This is illustrated in FIG. 8 of Reference 1. The latter approach requires substantially fewer comparators for a given bit output. Nevertheless, the converter of the latter type requires additional hardware: a sample-and-hold circuit, a D/AC for each stage except the last stage, and a device to produce a difference voltage, $\Delta V$. Also, if a differential amplifier is used to amplify the difference voltages, $\Delta V$, the ultimate conversion precision is still determined by the properties of the first stage comparator. This latter fact requires that the comparison in the first stage be made only after the transients have settled down to a value required by the precision of the whole device. This limits the speed and the precision of the converter with given comparators and sample-and-hold circuits.

SUMMARY OF THE INVENTION

The present invention is an improvement in A/DC which is applicable to parallel and series-parallel converters. The invention permits a reduction of the comparators in parallel type converters by at least one-half or increases at least twice the precision or range of series-parallel converters.

According to the present invention the quantizer contains only the number of comparators needed to quantize a portion of the range of an analog signal, which portion has a very high statistical probability of occurrence. The encoder, however, encodes the quantized levels into a binary code of a number of bits which suffice to represent the full range. When the analog signal falls outside of the said portion, a voltage is added or subtracted from the analog input to bring the quantized voltage within the range of the comparators. Also, a binary number is added or subtracted to the encoded output to compensate for the addition or subtraction of the voltage from the analog input. When the analog input falls back to a predetermined level in the range of the comparators, the system switches back to the state where the analog input is applied without addition or subtraction to the comparators and nothing is added to or subtracted from the encoder output.

A particular feature of the invention provides advance detection of the in-range or out-of-range condition of the analog signal to improve the precision and conversion time of series-parallel converters.

DETAILED DESCRIPTION OF THE PREFERRED EMBODIMENTS

Throughout the description that follows, the preferred embodiments will be described as operating on a TV analog signal. Also, the converters described will be eight comparator-four bit output converters, which, as will be apparent could represent a parallel converter or a single stage of a series-parallel converter. It will be appreciated, however, by anyone having ordinary skill in the art to which the invention pertains, that the invention is applicable to other analog signals and is not limited to eight comparator-four bit output converters.

It has been pointed out by Y. B. O'Neal, Jr. in "Predictive Quantizing System", Bell System Technical Journal, Vol. 45, No. 5, pp. 689-729, May-June, 1966, that the amplitude probability distribution of a TV signal is such that for 95% of the time, the amplitude is in the range from 25% to 75% of its maximum. Therefore, in the case of a quantizer designed for full range quantification, one-half of the quantizer is being used only 5% of the time. If a series-parallel A/DC is used the feedback D/AC will frequently have to change the most significant bit from 0 to 1. The transition from 0111 ... to 1000 ... causes the greatest transient in the system (Reference 1) and substantially contributes to the total distortion in the A/DC.

Figure 1:
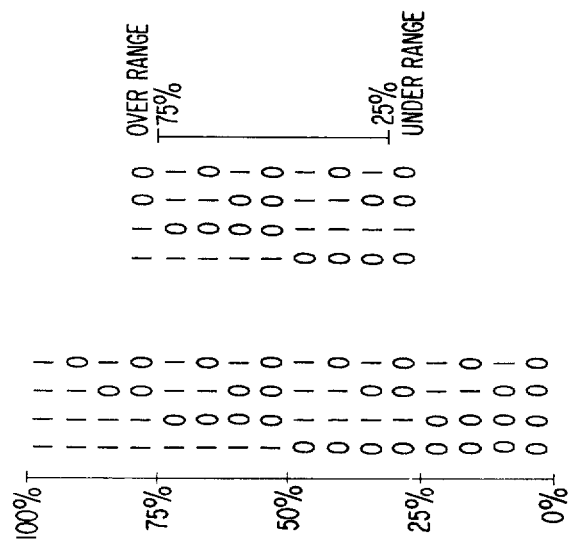
FIG. 1 illustrates the binary equivalent of full range and a portion of full range and is helpful in explaining the principle of operation of the invention.

The principle of the invention will be explained in connection with FIG. 1 wherein the full 100% range of the TV signal is indicated on the far left, the next adjacent column of digits represents the binary codes corresponding to sixteen quantization levels of full range, the next adjacent column represents binary codes for 50% of the range plus an over-range and under-range code, and the vertical line adjacent the last-mentioned column of binary codes indicates the 25% to 75% range of the signal.

A conventional parallel converter or single stage of a series-parallel converter having four bit precision would require sixteen or fifteen comparators in the quantizer. (It is noted here that n levels can be provided by n-1 comparators if the timing circuitry is set to provide a minimum level output in the absence of an output from all of the n-1 comparators.) In accordance with the present invention the quantizer is configured to operate only over a portion of the full range, e.g., between X% and Y% of full range, where X% is 25% and Y% is 75%. For a TV signal, the 25-75% range quantizer is adequate 95% of the time and requires only seven or eight comparators.

However, when the analog signal is above or below the 75% and 25% range the system operates to reduce or increase, respectively, the signal applied to the quantizer so that the latter signal will always be within the range of the quantizer. The binary code output of the encoder is also altered, by subtraction or addition of a binary number corresponding to the voltage added or subtracted, respectively, to provide a final code output which is the same as would be provided in the case of a full range quantizer.

Figure 2:
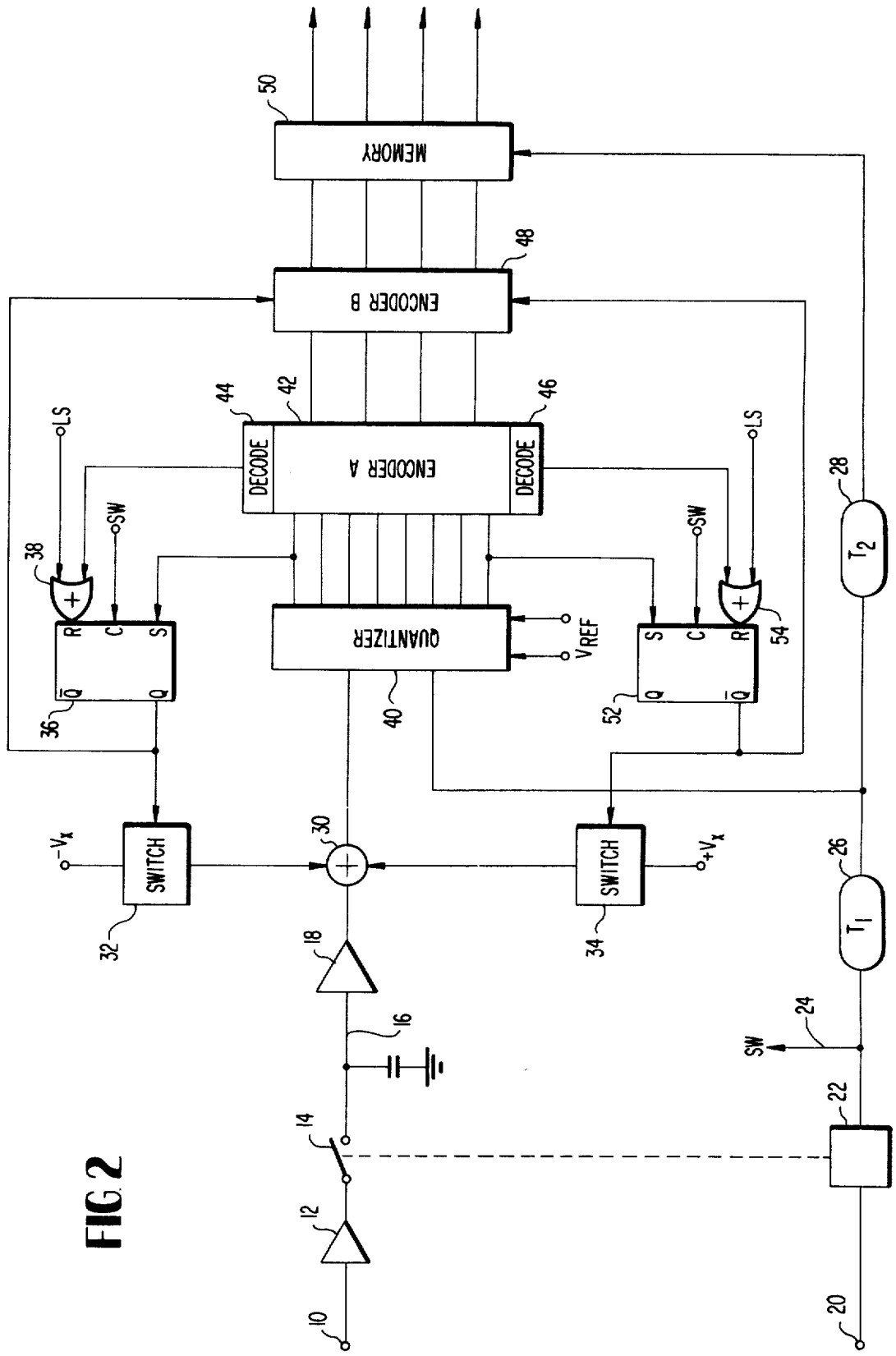
FIG. 2 is a block diagram of one embodiment of the present invention.

FIG. 2 illustrates one embodiment of the A/DC converter of the present invention. In general, the converter provides a four bit output representing sixteen quantization levels of the input signal but, the quantizer provides only nine quantization levels. The nine quantization levels comprise seven discrete levels over the 25%-75% range of the analog input, one level indicating under-range, and one level indicating above-range. As long as the analog input is in the 25%-75% range the converter operates conventionally. If the analog input is above the 75% range, the quantizer output indicates an above-range level. In the embodiment of FIG. 2 the above-range level, irrespective of the actual value of the analog signal, is encoded as 1100. From FIG. 1 it can be seen that code 1100 represents the level just above the 75% range. This is given only by way of example. The initial above-range level could be coded as any one of the levels 1100, 1101, 1110, 1111. Upon detection of the above-range level, an offset voltage corresponding to 25% of full range is subtracted from the analog input. The result is that the signal to the quantizer (analog input minus 25% full range) is shifted into the range of the quantizer, although it no longer represents the true analog input. In this case, the four bit output from the encoder differs from a correct digital code by an amount corresponding to 25% of full range. Thus, a second encoder, which is preferably a binary adder/subtractor operates in the above-range case to add a binary number corresponding to 25% of full range to the first encoder output. It will be appreciated that the effect of subtracting an offset voltage equal to 25% of full range from the input is to make the quantizer effective over a range corresponding to 50%-100% of full range. Consequently, this condition is referred to as above-range operation.

As will be appreciated an input signal in the 50%-75% range can be encoded in mid-range or above-range operation depending upon prior history. This is because once the converter switches to above-range operation it does not switch back to mid-range operation until the analog input drops substantially into the mid-range, e.g., 60%. Thus, a 70% signal which occurs while the system is in the above-range operation appears at the quantizer as a 45% signal. Carrying the example further, a 60% signal appears at the quantizer as a 35% signal. The system, however, is set so that the encoding of a 35% level output from the quantizer switches the system from above-range to mid-range operation. It will be appreciated that the latter switching is ineffective if the system is already in mid-range operation or if the system is in below-range operation.

The below-range operation exactly parallels the above-range operation. The difference is that a 25% offset voltage is added to the analog signal to bring the input to the quantizer within the range of the quantizer. A binary number corresponding to 25% full range is subtracted from the output of the first encoder to correct the four bit output. Also, when the analog signal, while in the below-range of 0%-50%, advances substantially into the mid-range, e.g., 35% (this will be initially seen by quantizer and encoder as a 60% signal) the converter switches from below-range to mid-range operation.

The embodiment of FIG. 2 includes a quantizer 40 for converting an analog input into level indicating output signals. In the specific example shown there are nine output lines representing seven levels between 25% and 75% of maximum, an above level condition and a below level condition. An encoder, 42, is connected to the quantizer output lines and operates to encode the level indicating signals into a four bit binary code. The output code from encoder 42 is a mid-range code corresponding to the output level from the quantizer. A correction encoder 48 operates upon the output of encoder 42 by adding and subtracting a binary value to and from, respectively, the output of encoder 42. The value added or subtracted corresponds to 25% of the full range of the input analog signal and is added or subtracted depending upon the state of operation of the system. The output of encoder 48, which is a four bit binary value corresponding to the analog input signal to the system, is applied to memory 50 where it is held until a control signal causes the memory 50 to transfer its contents to further utilization means.

The converter also includes timing control means, sample means, and range shifting means. The timing control means includes switching means 22, and delay means 26 and 28. Clock pulses are applied at terminal 20 at the rate which is set for sampling the input analog signal. Switch means 22 responds to each sample pulse in a known manner and operates to close switch 14. Although switch 14 is indicated as being connected to switch means 22 by a mechanical linkage it will be apparent to anyone of ordinary skill in the art that the switch means 22, the switch 14, and the interconnection, may be entirely electronic. The delay means 26 and 28 provide short delays to enable the circuits of the converter to settle prior to providing control pulses to those circuits. At the same time switch means 22 operates to close switch 14, it also supplies an output timing pulse SW on lead 24 to flip-flop circuits 36 and 52.

The sampling means includes amplifiers 12 and 18, storage capacitor 16, and the switch 14. The combination of switch 14, capacitor 16 and amplifier 18 is known as a sample and hold circuit. The analog input signal is applied at input terminal 10, amplified in amplifier 12, and sampled by means of the periodic closing of switch 14. Each sample of the analog signal is held by storage capacitor 16. The analog sample is applied via amplifier 18 to the quantizer 40. The quantizer 40 operates in response to the timing pulse from delay means 26 to convert the analog sample into level indicating output signals. As described previously, the quantizer is designed to operate over a mid-range corresponding to 25%–75% of the full range of the analog input signal.

Figure 3:
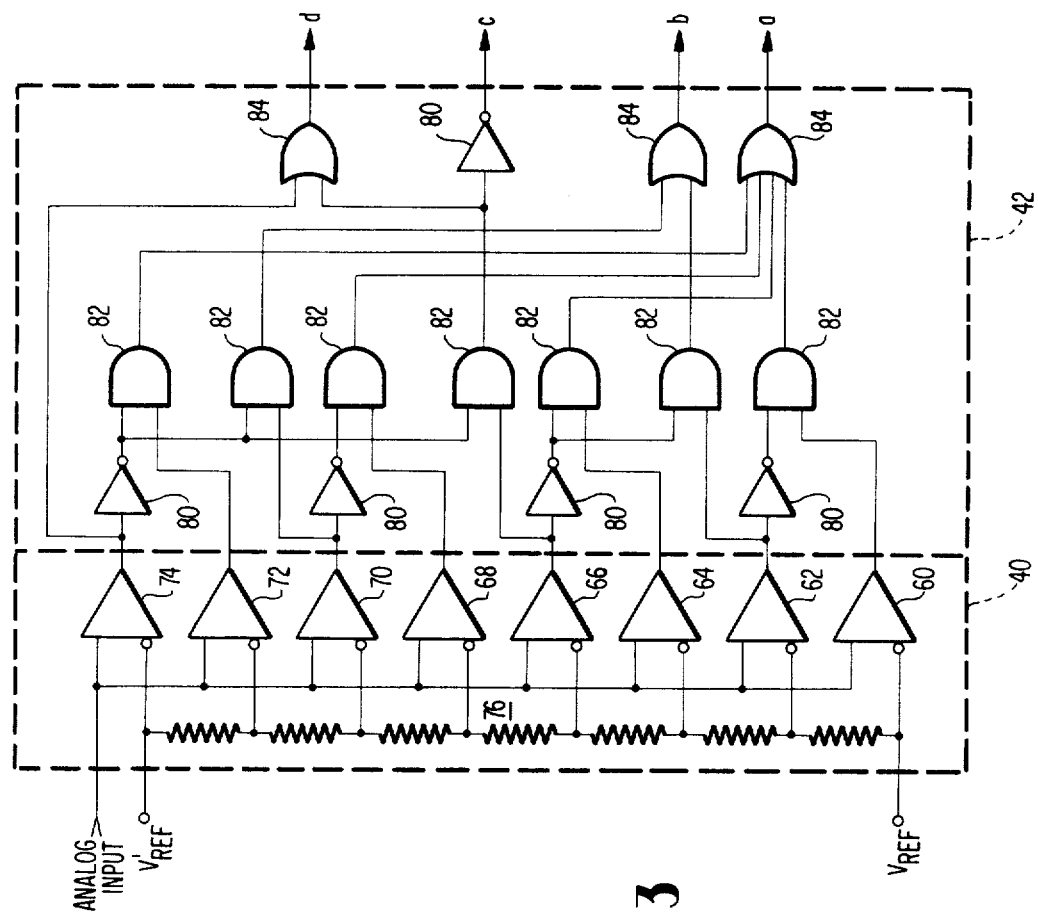
FIG. 3 is a partial block and partial schematic diagram of a quantizer and first encoder which can be used in the embodiments of FIGS. 2 and 4.

A specific example of the quantizer and the encoder 42 is illustrated in FIG. 3. The quantizer comprises eight comparator circuits 60–74 and a voltage divider 76. The voltage divider has eight equally spaced taps which are connected to the eight comparator circuits. Reference voltage $V_{ref}$ and $V'_{ref}$ are applied to the opposite ends of the voltage divider. The values of the reference voltages are selected to provide mid-range operation. Voltage $V'_{ref}$ corresponds to about 75% of the full range of the analog signal, and the voltage $V_{ref}$ corresponds to about 25% of the full range signal. The analog input to the quantizer is applied in parallel to each of the individual comparator circuits 60 through 74. Each comparator operates to provide a logic 0 output when the reference input thereto is greater than the analog input and to provide a logic 1 output when the analog input is equal to or greater than the reference input. Thus, if the analog input to the quantizer is below the 25% range all of the comparators will provide logic 0 outputs and if the analog input is above the 75% range all of the comparators will provide a logic 1 output. For analog values in the mid-range of 25%–75% the number of logic 1 outputs increases with increased value of the analog input.

The encoder 46 comprises five gates 80, seven AND gates 82, and three OR gates 84. The operation of the encoder 46 is self-explanatory. The output codes are indicated in the right-hand column of FIG. 1 of the drawings. When the analog input is below-range thereby resulting in logic 0 outputs from all comparators 60–74, the encoder 46 will provide the binary output 0100 which is a code indicating below-range. As can be seen from the logic circuit of encoder 46, in the latter condition, none of the AND gates 82 will receive two logic 1 inputs. Consequently, logic 0 outputs will appear at all of the AND gates 82 and the only logic 1 appearing at any of the output terminals d through a will appear at output terminal c. For the case where the analog input is above-range, all of the comparator outputs will be at logic 1 level and the encoder 46 will provide a four bit binary output code 1100 which, as shown in FIG. 1, corresponds to an over-range indication. Intermediate values will be encoded as indicated in the right-hand column of FIG. 1.

It will be noted that in FIG. 2 there is an input to the quantizer 40 from the delay means 26. Although this input is not shown in the detailed drawing of FIG. 3, it will be apparent that the timing input could be applied to an analog gate at the input to the quantizer or as a third input to each of the AND gates 82.

Under normal operation when the analog signal applied at input terminal 10 is within the 25%–75% range the four bit output code of encoder 42 fully represents the analog input signal. The four bit output code is passed through encoder 48 without change and applied to the memory 50. As will be appreciated the first analog sample which has a value above-range or below-range is encoded as 1100 or 0100. Thereafter, the control circuitry operates to add or subtract a 25% voltage from the analog sample in order to bring the input value applied to the quantizer back into the mid-range. The control circuitry includes summation means 30, a pair of analog switches 32 and 34, and a pair of flip-flop circuits 36 and 52. Initially both flip-flops are in the reset condition also referred to herein as the respective second states of the range shifting means. Assume, as an example, that the input analog sample held by storage capacitor 16 is above-range and both flip-flops are in the reset condition. It will be recalled that this condition will cause the output from comparator 74 to have a logic 1 value. The output from comparator 74 is connected to the set input of flip-flop 36. When this output becomes a logic 1 flip-flop 36 is switched to the set or first state thereby providing an energizing output to the analog switch 32 and the encoder 48. Analog switch 32 operates to connect offset voltage, $-V_x$, as an input to the summation means 30. The voltage, $|V_x|$, corresponds to 25% of full range. The latter voltage is subtracted from the analog sample held by storage capacitor 16. The quantizer 40 and encoder 46 operate in the manner previously described. However, the four bit output code will be an inaccurate representation of the analog sample value. In order to correct the four bit output code the encoder 48 operates to add a four bit binary number, corresponding to 0100, to the output from encoder 46. The result is a four bit output from encoder 48 which correctly represents the analog sample. The latter operation is the above-range operation of the converter.

The converter continues to operate in the above-range condition until the analog sample drops substantially into the mid-range. Thus, if the analog sample drops to 75% although that is in the mid-range it is not substantially in the mid-range so the above-range operation is maintained. The value which causes the converter to switch back to mid-range operation may be selected to be any of the values between 50% and 75%. As a specific example, the value corresponding to about 60% is selected. In the above-range operation the 60% input signal, after having the offset voltage subtracted therefrom, appears at the input to the quantizer as a 35% signal and is encoded by encoder 42 as 0111 (see FIG. 1). The latter code is detected by a decode means 44 which may be any simple logic arrangement for detecting the binary combinations 0111 or lower. The output from the decode means 44 is applied through OR gate 38 to the reset input terminal of flip-flop 36. When flip-flop 36 is reset to the second state the converter reverts to normal mid-range operation. It will be noted that the flip-flops 36 and 52 are clocked by the SW signal from switch means 22. This is to provide proper timing for the setting and resetting of the flip-flops. Also, in order to avoid setting the flip-flops by the synchronization pulses in the television analog signal, an additional signal, indicated as LS, is applied to the reset inputs of the flip-flops 36 and 52. The latter signal is derived from the synchronization and can, for example, reset the quantizer to the mid-range operation at the beginning of each scanned line of the television picture.

The below-range operation is substantially identical and is controlled by flip-flop 52 and analog switch 34. The below-range operation is terminated by decoder 46 which operates similar to decoder 44. The differences in the two operations are that flip-flop 52 is set when the output of comparator 60 (FIG. 3) is a logic 0, the analog switch 34 causes a 25% voltage to be added to the analog sample, and the decode circuit 46 resets flip-flop 52 thereby returning the quantizer to the mid-range operation when the analog sample reaches a value of approximately 40% or above.

The advantage of the device described thus far is that higher bit precision can be attained with a smaller number of comparators. As can be seen, the addition of two flip-flops, two analog switches and approximately four sample gates doubles the range of the analog to digital converter. If, for example, a parallel technique is used and seven bit precision is required (corresponding to 128 quantization levels) the technique of the present invention saves 64 comparators, which are substantially more complicated and more expensive than flip-flops and logic gates.

Figure 4:
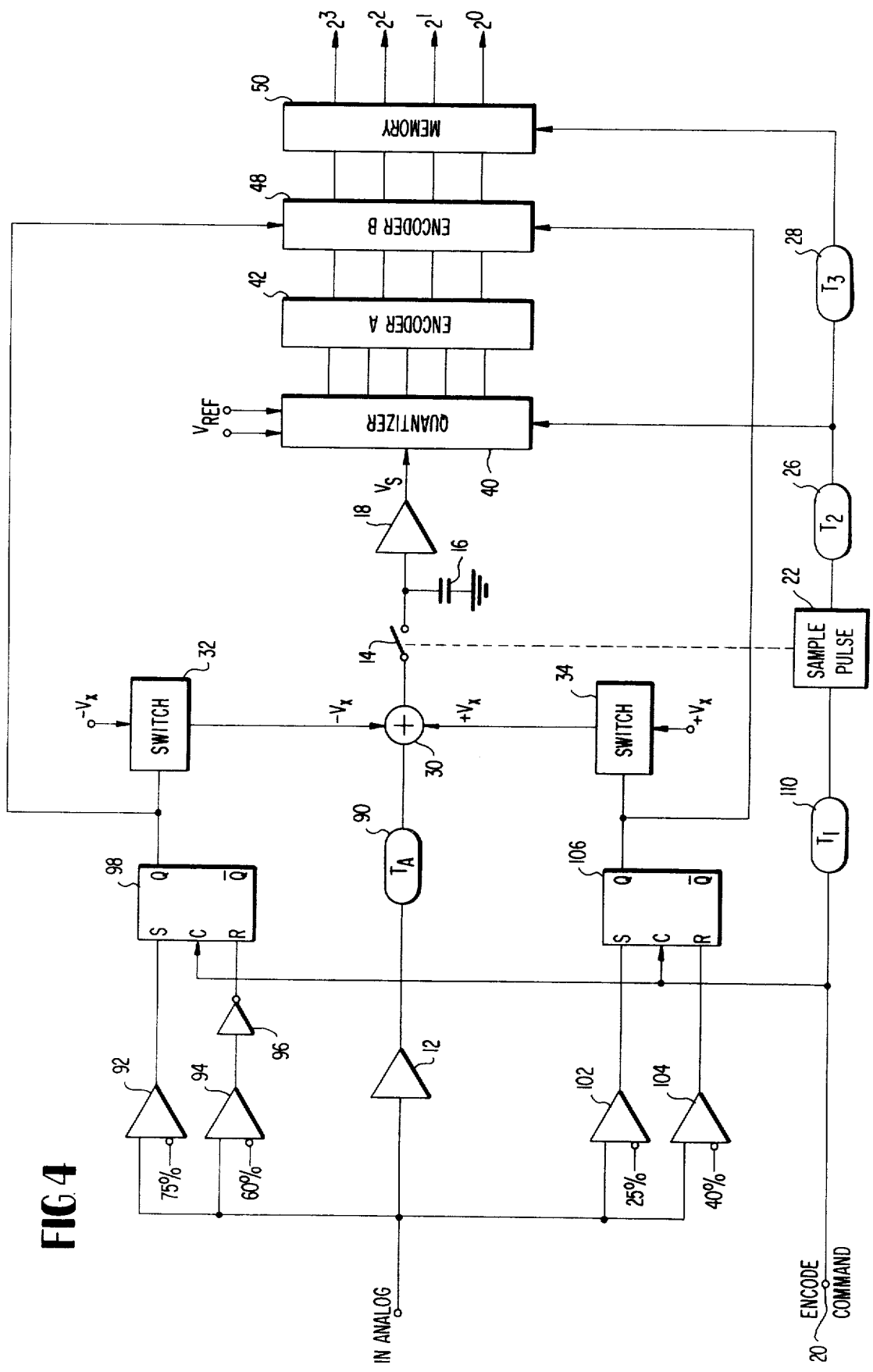
FIG. 4 is a block diagram of another embodiment of the present invention.

An alternate embodiment of the invention is shown in FIG. 4. This embodiment is of particular use in the series-parallel type of converters because it provides a feed-forward technique which permits the converter to switch to the above-range or below-range operation prior to encoding the first above-range or below-range analog signal. Most of the system of FIG. 4 is identical to that shown in FIG. 2, and where that identity exists the corresponding blocks are indicated by the same numerals as used in FIG. 2. Only the additional features of FIG. 4 will be described. As has been explained in Reference 1, in a multi-stage series-parallel converter without corrective feedback circuits the precision of the device is determined by the precision of the first stage comparators and the conversion time is substantially affected by the settling time of the digital to analog converters in the feedback circuit. The converter of FIG. 4 overcomes both of these difficulties. As long as the analog input voltage is in the limits from $-V_{ref}$ to $+V_{ref}$, the converter in FIG. 4 works exactly as that in FIG. 1. However, when the input voltage exceeds the positive or negative references at the time when the encode command pulse starts the conversion, the analog switches add or subtract the voltage $V_x$ from that appearing at the input of the sample and hold circuit. A delay is provided between the input analog signal and the summation circuit so that when the analog signal arrives at the summing point the switching transient of $V_x$ has already died out and the sample and hold circuit samples the true sum of the analog input voltage and the offset voltage $V_x$. This is equivalent to a shift of the range to the above or below-range operation.

These operations are controlled by comparator means and flip-flop means which are operable prior to the operation of the sample and hold circuit. As can be seen the clock pulse applied at 20 is delayed in delay means 110 prior to being applied to the sample circuit 22. The delay 110 is provided to allow presample detection of the anolog input signal. During the presample period comparators 92 and 102 operate to detect whether the analog input is above or below-range, respectively. Delay means 90 delays the application of the analog input signal to the summation means 30 and the sample and hold switch 14. The sample and hold switch 14 is placed after the summation means 30 whereas in FIG. 2 the sample and hold switch is placed prior to the summation means 30. As long as a signal is in mid-range flip-flops 98 and 106 will be in the reset condition, analog switches 32 and 34 will be open and the converter will operate in the same manner as the converter of FIG. 2. If the analog input signal goes above-range, there will be a logic 1 output from comparator 92 which in turn will set flip-flop 98. The output from flip-flop 98 closes switch 32 thereby providing the voltage $-V_x$ to the summation means 30. Also, the logic output from flip-flop 98 is applied as a control signal to the encoder 48 to cause the latter to add a value corresponding to 25% of full range to the output of encoder 42. The addition of comparator 94 to the control circuitry provides a hysteresis effect to the converter. Thus, once the system enters the above-range operation it will remain there even though the input voltage drops below the 75% range. However, when the input voltage drops below the 60% range comparator 94 will provide a logic 0 output to inverter 96. The output of inverter 96 will reset flip-flop 98 thereby causing the system to revert back to mid-range operation. The circuitry for controlling below-range operation includes comparators 102 and 104, and flip-flop 106. These circuits operate in a manner identical to that described above for the above-range operation control circuitry.

While the above-description has been limited to two specific embodiments, it will be apparent to anyone of ordinary skill in the art that the features of the invention are not so limited. One of the features of the invention is that the basic range of the converter covers only the most probable range of the signal. When the signal is outside this range the converter is shifted so that the conversion range is centered around the analog input amplitude which initiates the shifting. The converter returns to its normal range of operation after the input voltage is outside the shifted range, i.e., the switching threshold between different ranges has a substantial hysteresis. The feed-forward technique with delay in the analog channel as indicated in FIG. 4 is used in those operations when the error during the change of range must be held to a minimum. Also, although converters with only three ranges, above, medium, and below, have been shown it will be apparent that the number of ranges can be any number equal or greater than 2 and is dependent only on the statistics of the analog input signal and the required conversion precision and bit error rate.

What is claimed is:

1. An analog to digital converter for converting analog signals within a predetermined dynamic range comprising:

(a) quantization means having an input for receiving analog signals and an output for providing quantization output signals representative of the value of said analog signals, provided that said analog signals are within a predetermined mid-range, said mid-range having an upper limit and a lower limit defining a portion of said dynamic range in which said analog signals have a high probability of occurrence, said mid range having a central range and two outer ranges (b) a source of at least two offset voltage signals, (c) summation means connected to receive said analog signals and said offset voltage signals for producing an output signal, said output signal being connected to said quantization means input, (d) range shifting means comprising an input to receive said analog signal, an output connected to said source of voltage signals, a first means for detecting when said analog signal is outside said mid-range, a second means for detecting when said analog signal is within one of said outer ranges of said mid-range and a third means for applying one of said offset voltages to said summation means when said analog signal is outside said mid-range and for subsequently removing said offset voltage when said analog signal is within said predetermined portion of said mid-range, said offset voltage having a magnitude less than the magnitude of the mid-range of said quantizer and being selected to shift the range of said quantizer to a different range which overlaps said mid-range, (e) first encoder means connected to receive said quantization output signals for producing a first binary coded output signal, and (f) second encoder means having a first input connected to receive said first binary coded output signal and a second input connected to said output of said range shifting means for adding to said first binary coded output signal a binary number equal to the value of said offset voltage when said analog signal is outside said mid-range for providing a second binary coded output signal representating the digital equivalent of said analog signal.

2. An analog-to-digital converter for converting analog signals within a predetermined dynamic range comprising:

(a) quantization means for receiving analog signals and determining whether said signals are either within a predetermined mid-range or outside said mid-range, said mid-range having an upper limit and a lower limit defining a portion of said dynamic range in which said analog signals have a high probability of occurrence said mid range having a central range and two outer ranges and said quantization means providing output indicating signals representing the levels of said within-range analog signals and identifying whether said signals are out-of-range, (b) summation means having at least two inputs and one output for summing voltages applied to said inputs, one input being connected to receive said analog signal and said output being applied to said quantization means, (c) first encoder means connected to receive said output indicating signals from said quantization means, for producing a first binary coded signal, (d) a decode means connected to receive said first binary coded signal from said first encoder means for detecting when said analog signal received by said quantization means falls within a predetermined portion of said mid-range, (e) at least one range shifting means responsive to both said quantization means and said decoder means, for applying a preset offset voltage to said second input of said summation means when said analog signal is outside said mid-range and for subsequently removing said offset voltage when said analog signal falls within said one of said outer ranges of said mid-range, the magnitude of said offset voltage being less than the magnitude of the mid-range of said quantization means and being selected to shift the range of said quantization means to a different range which overlaps said mid-range, and (f) second encoder means having a first input connected to receive said first binary coded output signal from said first encoder means and a second input responsive to said range shifting means for adding to said first binary coded output signal a binary number equal to the value of said offset voltage when said analog signal is outside said mid-range for providing a second binary coded output signal representing the digital equivalent of said analog signal.

3. An analog to digital converter adapted to convert analog signals within a predetermined dynamic range comprising:

(a) quantization means for detecting when said analog signals are either within a predetermined mid-range or outside said mid-range, said means providing level indicating signals representing the levels of said within-mid-range analog signals and identifying whether said signals are out-of-mid-ranges, said mid range having a central range and two outer ranges (b) summation means having at least two inputs and one output for summing voltages applied to said inputs, one input being connected to receive said analog signal and said output being applied to said quantization means, (c) at least one range shifting bistable device responsive to the output of said quantization means for applying, when in a first stable state, a fixed offset voltage to the second input of said summation means, the value of said offset voltage being selected to cause the output of said summation means to be within said mid-range when said analog signals are outside said mid-range, (d) means connected to receive said indicating signals from said quantization means for switching said range shifting bistable device to said first stable state when said indicating signals indicate the analog signals are outside said mid-range, (e) first encoder means connected to receive said within-mid-range level indicating outputs from said quantizer for producing a first binary coded signal, (f) means connected to receive said first binary coded signal for shifting said range shifting bistable device to its second stable state whenever the analog signal to said quantizer falls within one of said outer ranges of said mid-range whereby said offset voltage is subsequently removed from said summation means, and (g) second encoder means having a first input connected to receive said first binary coded signal and a second input connected to said bistable device, said means being adapted to add to said first binary coded signal a binary number corresponding to said offset voltage when said analog signal is outside said mid-range, for providing an output binary coded signal representing the digital values of said analog signals.

4. An analog to digital converter as claimed in claim 3 further including means adapted to receive analog input signals and sample and hold circuit means connected between said input means and said summation means.

5. An analog to digital converter as claimed in claim 4 wherein said quantizer means comprises comparator circuits adapted to provide level indicating output signals for input voltages between X and Y percent of said predetermined range and two out-of-range signals for input voltages above and below, respectively, said Y and X percent of said predetermined range.

6. An analog to digital converter as claimed in claim 5 wherein said at least one range shifting bistable device provides said offset voltage to said summation means when in a first state, said first offset voltage having a value which when added to an input analog signal provides an output analog signal which is less than said input analog signal by an amount equal to the difference between the maximum of said predetermined range and Y percent of said predetermined range.

7. An analog to digital converter as claimed in claim 5 further comprising a second range shifting bistable device having first and second states for applying and not applying a second offset voltage to an input of said summation means when in said first and second states, respectively, said second offset voltage having a value which when added to an input analog signal provides an output analog signal which is greater than said input signal by an amount equal to the difference between X percent of said predetermined range and the minimum value of said predetermined range.

8. An analog to digital converter as claimed in claim 7 wherein said first encoding means is responsive to said level indicating outputs from said quantizer for encoding said levels into an n bit binary code where $2^n$ is substantially greater than the number of level indicating outputs which said quantizer can provide.

9. An analog to digital converter as claimed in claim 8 wherein said binary number in said second encoder means represents said second offset voltage in response to said second range shifting bistable device being in the first state.

10. An analog to digital converter as claimed in claim 9 wherein said means for switching said one range shifting bistable device to its first state is responsive to the one of said out-of-range signals from said quantizer representing a quantizer input above said Y percent of said predetermined range.

11. An analog to digital converter as claimed in claim 10 wherein said means for switching said one range shifting bistable device to said second state is responsive to said binary code from said first encoder means representing a value less than M percent of said predetermined range, where M percent is less than Y percent and greater than X percent.

12. An analog to digital converter as claimed in claim 11 further comprising means responsive to the one of said out-of-range signals from said quantizer representing a quantizer input below said X percent of said predetermined range for switching said second range shifting bistable device to its first stable state.

13. An analog to digital converter as claimed in claim 12 further comprising means responsive to said binary code from said first encoder means representing a value greater than N percent of said predetermined range, where N percent is greater than X percent and less than Y percent, for switching said second range shifting means to said second state.

14. An analog to digital converter as claimed in claim 12 wherein said first encoding means comprises means responsive to said two out-of-range signals for providing first and second n bit binary codes representing, respectively, a value between the maximum of and Y percent of said predetermined range and a value between the minimum of and X percent of said predetermined range.

15. An analog to digital converter adapted to convert analog signals within a predetermined dynamic range having upper and lower limits comprising:
(a) quantization means responsive to analog signals within a predetermined mid-range for providing indicating signals representing the level of said analog signals, said mid-range being within a portion of said dynamic range which represents signals having a high probability of occurrence, said mid range having a central range and two outer ranges
(b) summation means, having at least two inputs and one output, for summing voltages applied to said inputs, one input being connected to receive said input analog signal, said output being applied to said quantization means,
(c) at least one range shifting bistable device having first and second stable states for applying and not applying, respectively, an offset voltage to a second input of said summation means, the value of said offset voltage being preselected to cause the output of said summation means to be within said mid-range,
(d) first means for detecting when said analog input signals are outside said mid-range and for switching said range shifting bistable device to its first state when the value of said analog signal is detected to be outside said mid-range,
(e) second means for detecting when said analog input signals are within one of said outer ranges of said mid-range and for switching said range shifting bistable device to its second state when said analog input signal falls within said outer ranges of said mid-range,
(f) first encoder means connected to receive said indicating signals from said quantization means for producing a first binary coded signal, and
(g) second encoder means having a first input connected to receive said first binary coded signal and a second input connected to said bistable device for adding to said first binary coded signal a binary number corresponding to said offset voltage when said analog signal is outside said mid-range for providing an output binary coded signal representing the digital value of said analog input signals.

16. An analog to digital converter as claimed in claim 15 further including means adapted to receive analog input signals and an analog delay means connected between said input means and said summation means, and a sample and hold circuit connected between the output of said summation means and the input of said quantizer means.

17. An analog to digital converter as claimed in claim 15 wherein said portion of said predetermined range which is quantized by said quantizer is between an upper level and lower level of Y percent and X percent, respectively, of said predetermined range.

18. An analog to digital converter as claimed in claim 17 wherein said at least one range shifting bistable device provides said offset voltage to said summation means when in a first state, said first offset voltage having a value which when added to an input analog signal provides an output analog signal which is less than said input analog signal by an amount equal to the difference between the maximum of said predetermined range and Y percent of said predetermined range.

19. An analog to digital converter as claimed in claim 18 further comprising a second range shifting bistable device having first and second states for applying and not applying a second offset voltage to a third input of said summation means when in said first and second states, respectively, said second offset voltage having a value which when added to an input analog signal provides an output analog signal which is greater than said input signal by an amount equal to the difference between X percent of said predetermined range and the minimum value of said predetermined range.

20. An analog to digital converter as claimed in claim 19 wherein said first encoding means is responsive to said level indicating outputs from said quantizer for encoding said levels into an n bit binary code where $2^n$ is substantially greater than the number of level indicating outputs which said quantizer can provide.

21. An analog to digital converter as claimed in claim 19 wherein said binary number in said second encoder means represents said second offset voltages in response to said second range shifting bistable device being in the first state.

22. An analog to digital converter as claimed in claim 21 wherein said means for switching said one range shifting bistable device to its first state is responsive to said analog input signal having a value above Y percent of said predetermined range.

23. An analog to digital converter as claimed in claim 22 wherein said means for switching said one range shifting bistable device to its second state is responsive to said analog input signal having a value below M percent of said predetermined range, where M percent is less than Y percent and greater than X percent.

24. An analog to digital converter as claimed in claim 23 further comprising means responsive to said analog input signal having a value below X percent of said predetermined range for switching said second range shifting means to said first state.

25. An analog to digital converter as claimed in claim 23 further comprising means responsive to said analog input signal having a value above N percent of said predetermined range for switching said range shifting means to said second state, where N percent is greater than X percent and less than Y percent.

* * * * *